(12) United States Patent
Kim

(10) Patent No.: US 7,101,783 B2
(45) Date of Patent: Sep. 5, 2006

(54) METHOD FOR FORMING BIT-LINE OF SEMICONDUCTOR DEVICE

(75) Inventor: Hyung Ki Kim, Gyeonggi-do (KR)

(73) Assignee: Hynix Semiconductor Inc., Gyeonggi-Do (KR)

( * ) Notice: Subject to any disclaimer, the term of this patent is extended or adjusted under 35 U.S.C. 154(b) by 80 days.

(21) Appl. No.: 10/879,299

(22) Filed: Jun. 30, 2004

(65) Prior Publication Data

US 2005/0136594 A1 Jun. 23, 2005

(30) Foreign Application Priority Data

Dec. 23, 2003 (KR) .................. 10-2003-0095303

(51) Int. Cl.
*H01L 21/4763* (2006.01)
(52) U.S. Cl. .................. 438/618; 438/648; 438/683
(58) Field of Classification Search .................. 438/618, 438/645, 648, 685, 706, 622, 637, 638, 643, 438/675, 680
See application file for complete search history.

(56) References Cited

U.S. PATENT DOCUMENTS 6,455,410 B1 * 9/2002 Shimizu .................. 438/622
6,670,268 B1 * 12/2003 Shin et al. .................. 438/637

* cited by examiner

*Primary Examiner*—David Nelms
*Assistant Examiner*—Quoc Hoang

(57) ABSTRACT

Disclosed is a method for forming a bit-line of a semiconductor device. In a line patterning process for forming a bit-line in a DRAM (Dynamic Random Access Memory) of a semiconductor device, a barrier metal layer and a tungsten layer are sequentially formed on an interlayer insulating film comprising a contact hole to fill the contact hole by a CVD (Chemical Vapor Deposition) method. Then, the barrier metal layer and the tungsten layer are removed until the interlayer insulating film is exposed, and a tungsten layer having small thickness is re-formed on the exposed interlayer insulating film by a PVD (physical Vapor Deposition) method. As a result, the bit-line area is reduced as much as the barrier metal layer removed from the upper portion of interlayer insulating film, thereby having low bit-line capacitance.

6 Claims, 7 Drawing Sheets

METHOD FOR FORMING BIT-LINE OF SEMICONDUCTOR DEVICE

BACKGROUND OF THE INVENTION

1. Field of the Invention

The present invention relates to a method for forming a bit-line of a semiconductor device, and more specifically, to a method for forming a bit-line of a semiconductor device having low bit-line capacitance. In a line patterning process for forming a bit-line in a DRAM (Dynamic Random Access Memory) of a semiconductor device, a barrier metal layer and a tungsten layer are sequentially formed on an interlayer insulating film comprising a contact hole to fill the contact hole by a CVD (Chemical Vapor Deposition) method. Then, the barrier metal layer and the tungsten layer are removed until the interlayer insulating film is exposed, and a tungsten layer having small thickness is re-formed on the exposed interlayer insulating film by a PVD (physical Vapor Deposition) method. As a result, the bit-line area is reduced as much as the barrier metal layer removed from the upper portion of the interlayer insulating film, thereby having low bit-line capacitance.

2. Description of the Prior Art

Due to high integration and high capacity of semiconductor devices, capacity of a DRAM device increases with increase of the number of charged and discharged bits. However, the cell size of semiconductor devices is decreased, and it is difficult to obtain sufficient capacitance necessary for operation of the device. The capacitance C is proportional to the dielectric constant $\epsilon$ and the storage electrode surface area A, and is inversely proportional to the thickness d of the dielectric film as follow Equation 1.

$$C = \varepsilon \frac{A}{d} \qquad \text{[Equation 1]}$$

If the capacitance of the device is not secured, coupling capacitance of various wires for forming a cell array increases, and the subsequent sensing margin of a sense amplifier decreases. Therefore, the capacitance is secured by using a method of increasing the cell capacitance Cs or decreasing the bit-line capacitance Cb.

However, to use the method of increasing the cell capacitance, a dielectric material having a large dielectric constant is used or a cap oxide film having a thick thickness is formed. As a result, wires of bit-line are formed of tungsten and TiN having low resistance to decrease the capacitance of the bit-line. However, since it is difficult to effectively reduce the capacitance of the bit-line using the above-described method, studies have been made to solve the problem.

FIGS. 1a to 1d are cross-sectional diagrams illustrating a conventional method for forming a bit-line of semiconductor.

Referring to FIG. 1a, a polysilicon layer (not shown), a conductive layer for gate electrode (not shown) and a hard mask nitride film (not shown) are sequentially formed on a semiconductor substrate 1 comprising a device isolation film 2.

A selective etching process is performed on the hard mask nitride film (not shown), the conductive layer for gate electrode (not shown) and the polysilicon layer (not shown). A gate line 6 where a polysilicon pattern 3, a conductive layer for gate electrode 4 and a hard mask nitride film pattern 5 are sequentially stacked is formed.

As shown in FIG. 1b, an interlayer insulating film (not shown) is formed on the semiconductor substrate including the gate line 6 of FIG. 1a. Then, the selective etching process is performed until the upper surface of the hard mask nitride film pattern 5 and the semiconductor substrate 1 to form an interlayer insulating film pattern 8 having a bit-line contact hole 10 of a cell region and a bit-line contact hole 12 of a peripheral circuit region.

As shown in FIG. 1c, a barrier metal layer 14 using Ti/TiN and a CVD tungsten layer 16 are sequentially formed on the semiconductor substrate including the bit-line contact holes 10 and 12 of FIG. 1b.

The barrier metal layer 14 has a thickness ranging from 100 to 200 Å, and the CVD tungsten layer has a thickness of less than 1000 Å.

A photoresist pattern 18 is formed on the upper surface of the CVD tungsten layer 16 of FIG. 1c via an exposure and developing process. Then, as shown in FIG. 1d, the CVD tungsten layer is etched using the photoresist pattern 18 as an etching mask to form a CVD tungsten pattern 16-1.

However, since the barrier metal layer as conductor for bit line and the CVD tungsten layer are stacked at the small thickness on the upper surface of the interlayer insulating film, the area of bit-line becomes larger and capacitance becomes higher in subsequent formation of a capacitor, thereby decreasing the sensing margin of the subsequent DRAM operation.

SUMMARY OF THE INVENTION

It is an object of the present invention to provide a method for forming a bit-line of a semiconductor device which can embody low bit-line capacitance by re-forming a thin tungsten layer after removing a barrier metal layer formed on an interlayer insulating film to reduce the area of a bit-line.

In an embodiment, there is provided a method for forming a bit-line of a semiconductor device, comprising the steps of:

forming a gate electrode on a semiconductor substrate comprising a device isolation film;

forming an interlayer insulating film on the semiconductor substrate including the gate electrode;

selectively etching the interlayer insulating film to form a bit-line contact hole exposing an upper surface of the gate electrode and a portion of the semiconductor substrate;

forming a barrier metal layer on the interlayer insulating film including the bit-line contact hole;

forming a CVD tungsten layer filling the bit-line contact hole on the barrier metal layer;

polishing the CVD tungsten layer and the barrier metal layer until the interlayer insulating film is exposed to form a bit-line contact plug;

forming a PVD tungsten layer on the interlayer insulating film and the upper surface of the bit-line contact plug;

selectively etching the PVD tungsten layer to form a tungsten bit-line.

As described above, a barrier metal layer and a CVD tungsten layer are thickly stacked on an interlayer insulating film in a conventional method for forming a bit-line. However, in an embodiment of the present invention, a barrier metal layer formed on an interlayer insulating film is removed, and a thin PVD tungsten layer is re-formed on the resulting structure. As a result, bit-line contact plugs have a reduced area, thereby embodying the low bit-line capacitance and increasing the sensing margin in the subsequent DRAM operation.

DETAILED DESCRIPTION OF THE PREFERRED EMBODIMENTS

Hereinafter, the present invention will be described in detail with reference to the accompanying drawings.

FIGS. 2a to 2e are cross-sectional diagrams illustrating a method for forming a bit-line according to an embodiment of the present invention.

Figure 1A:
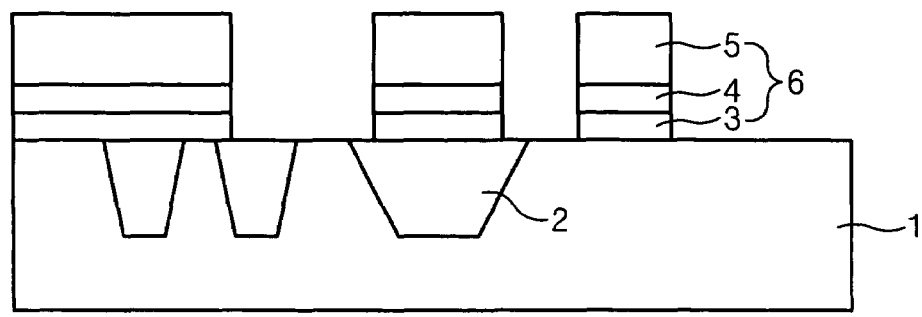
FIGS. 1a to 1d are cross-sectional diagrams illustrating a conventional method for forming a bit-line.
Figure 1B:
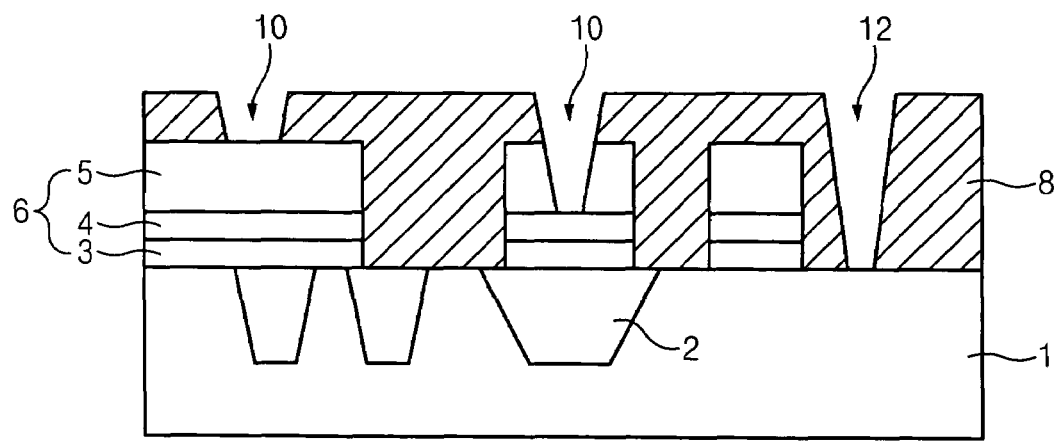
Figure 1C:
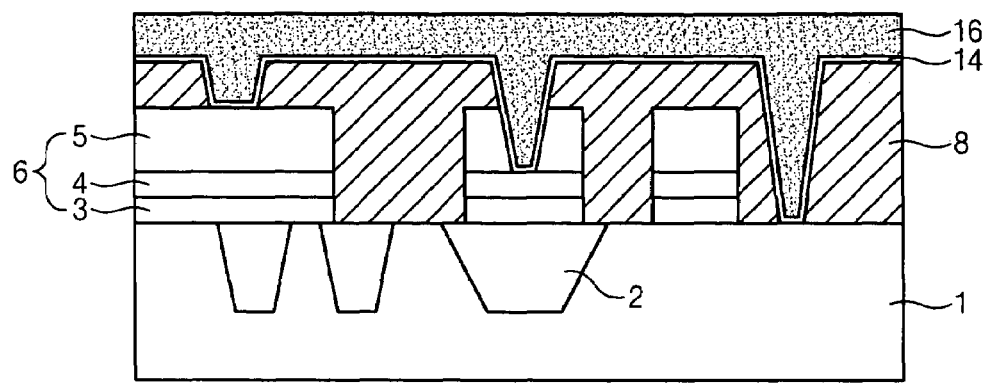
Figure 1D:
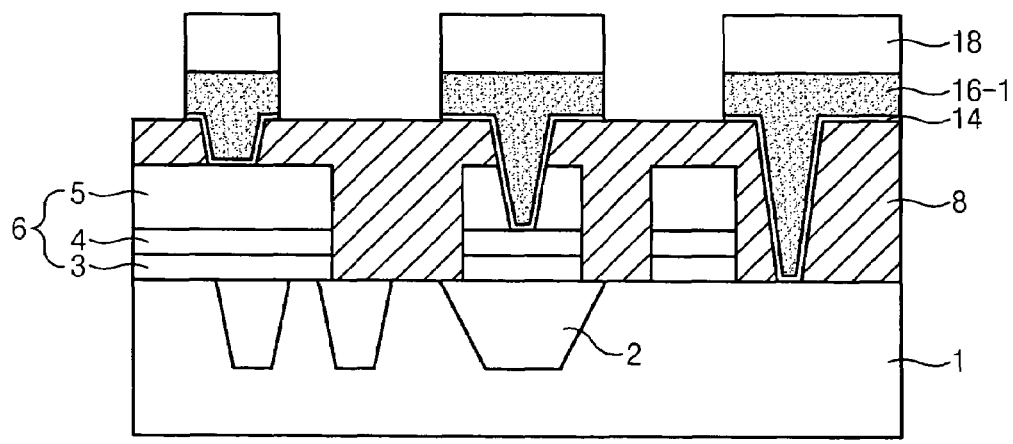
Figure 2A:
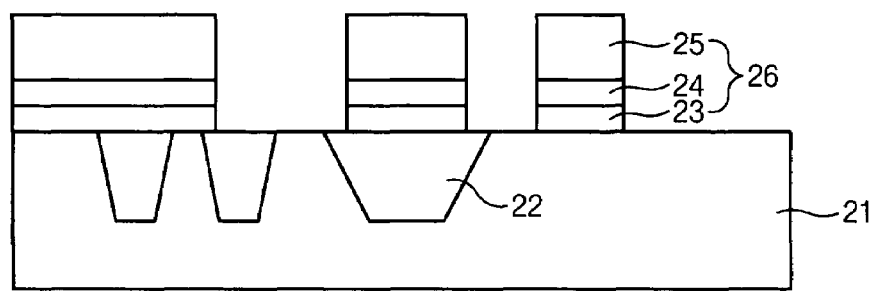
FIGS. 2a to 2e are cross-sectional diagrams illustrating a method for forming a bit-line according to an embodiment of the present invention.

Referring to FIG. 2a, a polysilicon layer (not shown), a conductive layer for gate electrode (not shown) and a hard mask nitride film (not shown) are sequentially formed on a semiconductor substrate 21 comprising a device isolation film 22.

A selective etching process is performed on the hard mask nitride film (not shown), the conductive layer for gate electrode (not shown) and the polysilicon layer (snot shown). Then, a gate line 26 where a polysilicon pattern 23, a conductive pattern for gate electrode 24 and a hard mask nitride film pattern 25 are sequentially stacked is formed.

Figure 2B:
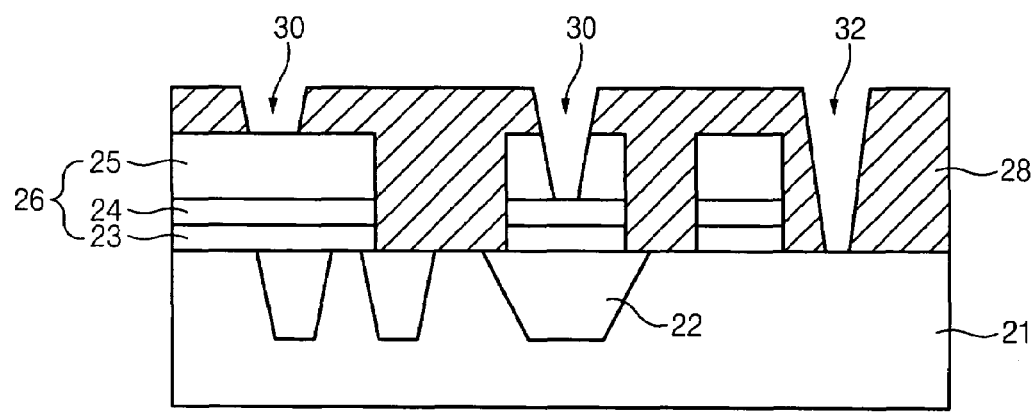

As shown in FIG. 2b, an interlayer insulating film (not shown) is formed on the semiconductor substrate including the gate line 26 of FIG. 2a, and then the selective etching process is performed until the upper surface of the hard mask nitride film pattern 25 and the a portion of the semiconductor substrate 21 are exposed. As a result, an interlayer insulating film pattern 28 comprising a bit-line contact hole 32 of a cell region and a bit-line contact hole 30 of a peripheral circuit region is formed.

Here, the interlayer insulating film has a thickness ranging from 1000 to 2000 Å.

Figure 2C:
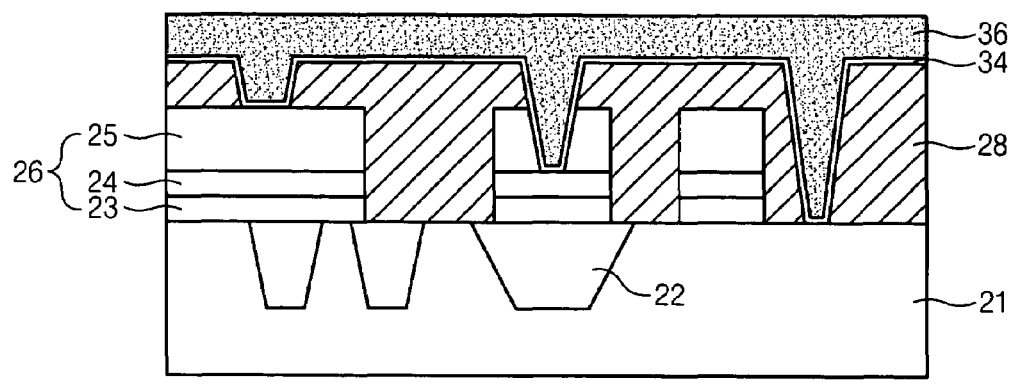

As shown in FIG. 2c, a barrier metal layer 34 and a CVD tungsten layer 36 filling the bit-line contact plug are sequentially formed on the semiconductor substrate including the bit-line contact hole 30 and 32 of FIG. 2b to fill the bit-line contact holes.

Here, the barrier metal layer is preferably formed using Ti/TiN at a thickness ranging from 100 to 200 Å. The CVD tungsten layer has a thickness ranging from 2000 to 3000 Å.

Figure 2D:
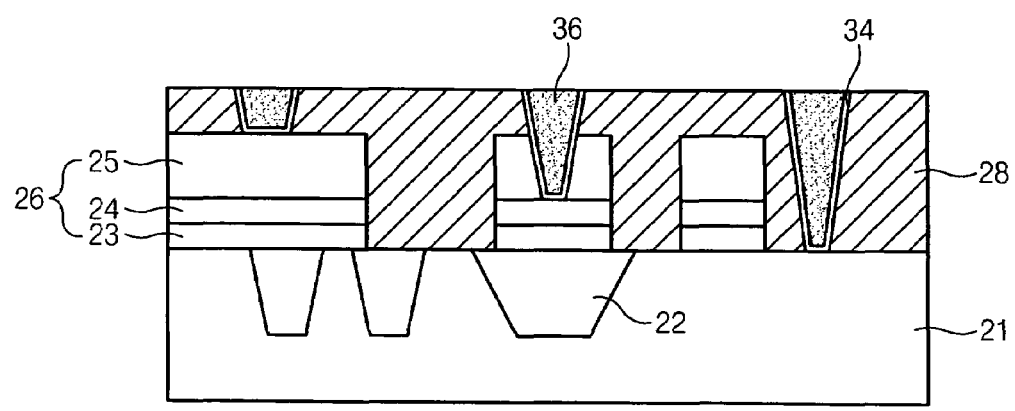

The polishing process are performed on the CVD tungsten layer 36 and the barrier metal layer 34 of FIG. 2c until the interlayer insulating film 28 is exposed. As shown in FIG. 2d, both of the barrier metal layer and the tungsten layer and the upper portion of the interlayer insulating film are removed.

The polishing process comprises an etch-back process using $SF_6$ (sulphur hexafluoride), $Cl_2$ and $BCl_3$. In the etching process, the barrier metal layer and the CVD tungsten layer may be removed at the same time until the interlayer insulating film is exposed. Otherwise, after the CVD tungsten layer is etched until the barrier metal layer is exposed, the barrier metal layer may be removed until the interlayer insulating film is exposed via a subsequent polishing process using common metal slurry.

Figure 2E:
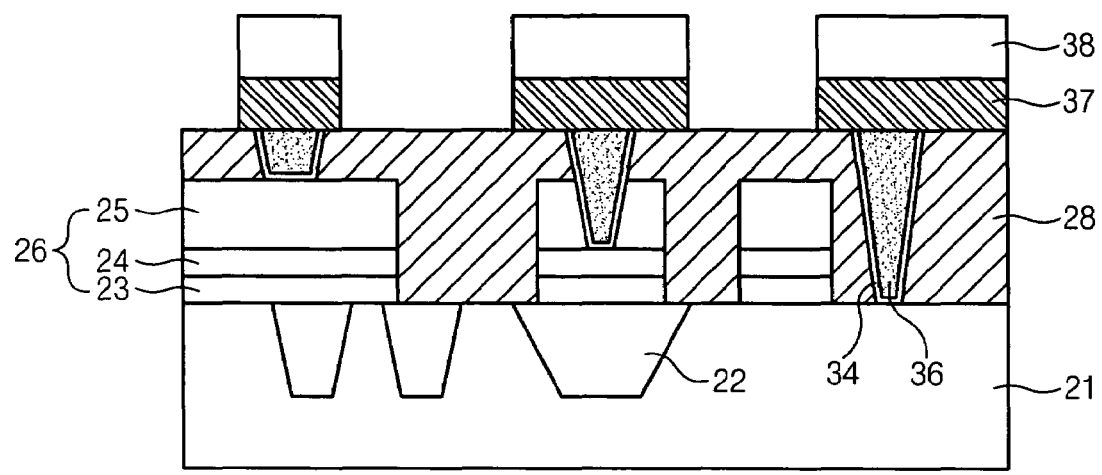

Referring to FIG. 2e, a sputter etching process is preferably performed on the interlayer insulating film pattern 28 and upper surface of the bit-line contact hole in order to remove Ti/TiN residuals in the removal process of the barrier metal layer and the CVD tungsten layer.

Thereafter, a PVD tungsten layer (not shown) has a thickness ranging from 500 to 700 Å.

Here, the tungsten layer is preferably formed by using a PVD method because the tungsten layer formed by a CVD method is not uniformly formed on the upper surface of the interlayer insulating film which is an oxide film.

After the CVD tungsten layer 36 and the barrier metal layer 34 are removed, the PVD tungsten layer is formed within 2 hours to prevent increase of contact resistance by pollution resulting from process delay.

Thereafter, a photoresist pattern 38 is formed on the PVD tungsten layer (not shown), and a PVD tungsten layer pattern 37 is formed by etching the PVD tungsten layer (not shown) using the photoresist pattern 38 as an etching mask.

Figure 2F:
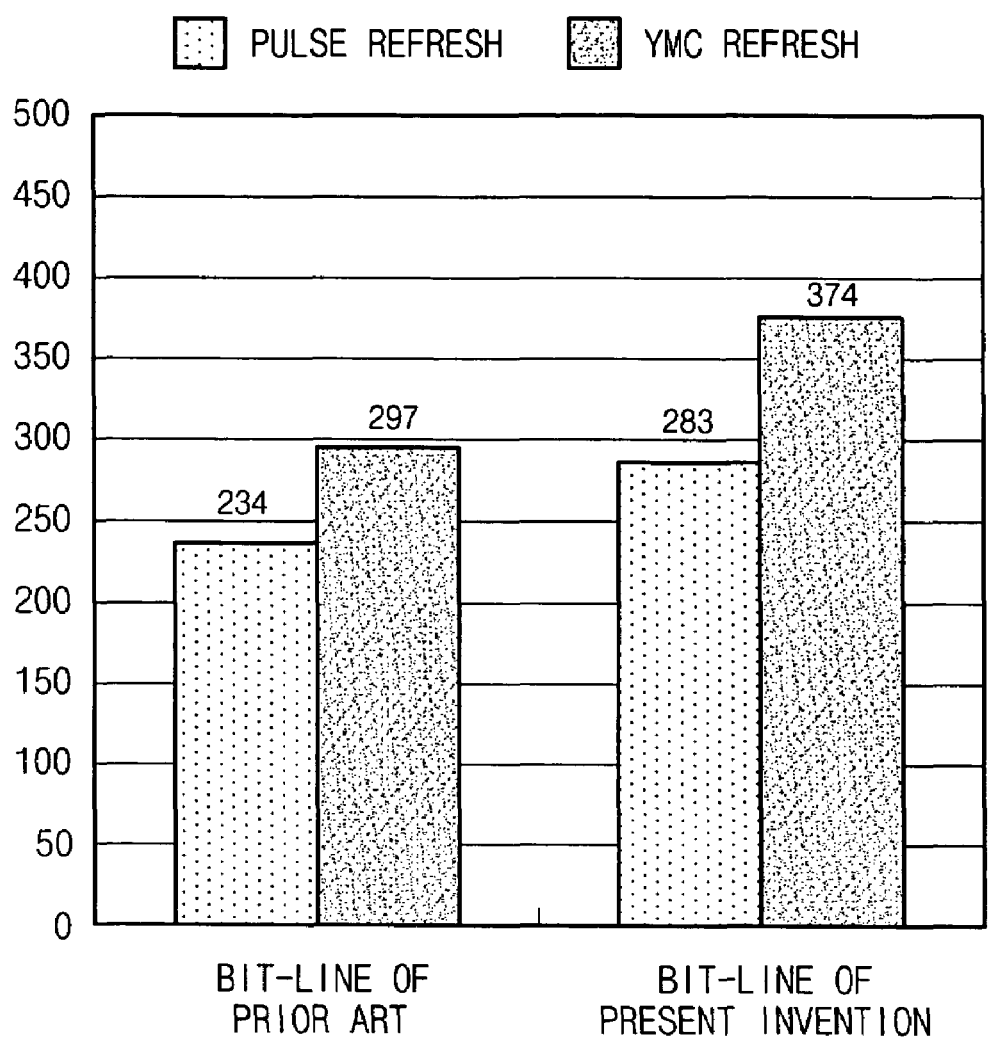
FIG. 2f is a graph illustrating the refresh operation of the bit-line formed according to an embodiment of the present invention.

As shown in FIG. 2f, the bit-line formed by the above-described method according to an embodiment of the present invention has improved pause refresh from 234 ms to 283 ms, and improved YMC (Y-March column) refresh from 297 ms to 374 ms. That is, the refresh characteristic is improved to 30 ms.

Figure 2G:
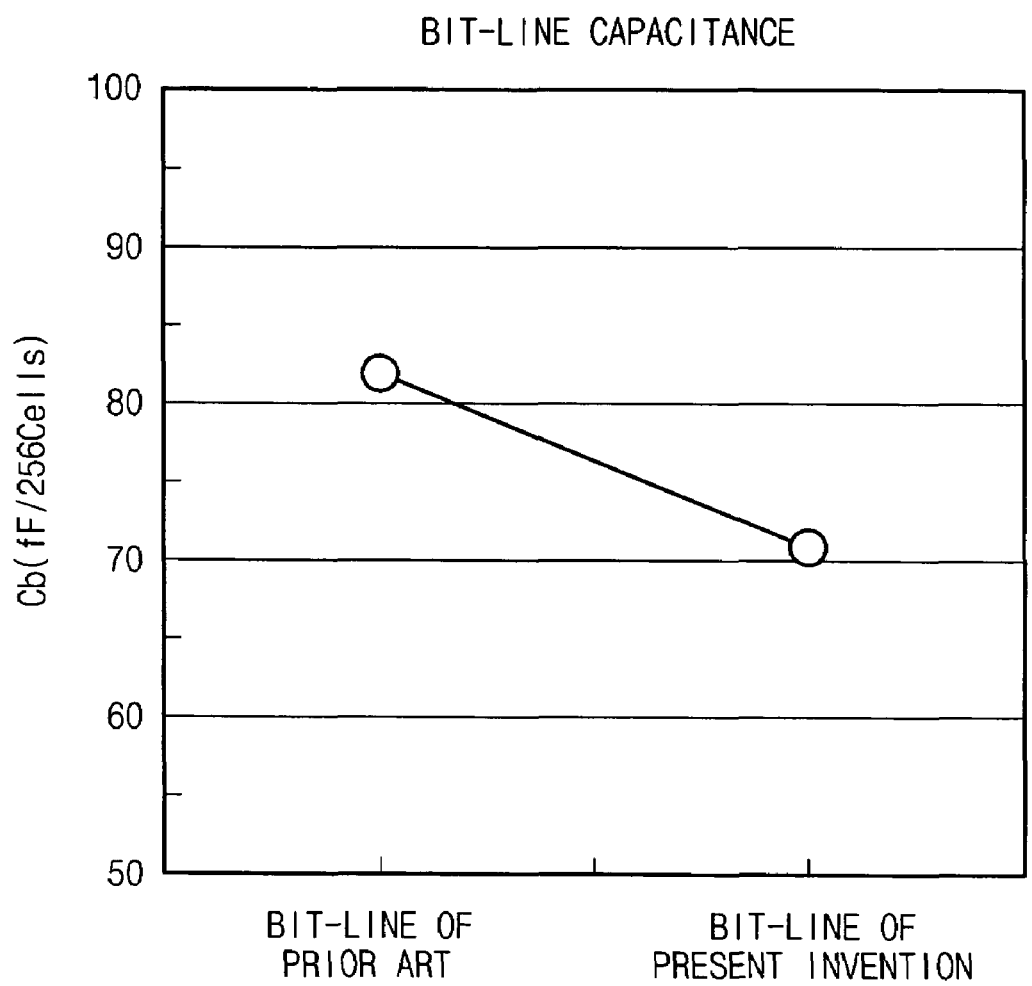
FIG. 2g is a graph illustrating the capacitance of the bit-line formed according to an embodiment of the present invention.

As shown in FIG. 2g, while the conventional bit-line capacitance is 85 fF/256 cell, the disclosed bit-line capacitance is 70 fF/256 cell, thereby having the improved Rs to 15% and the improved sensing margin to 30 mV.

The disclosed method for forming a bit-line of a semiconductor device may be applied to a line-type SAC (self-alignment contact) process and a hole-type SAC process in storage node contact formation methods.

As discussed earlier, in an embodiment of the present invention, a metal deposition layer having small thickness is formed on an upper portion of an interlayer insulating film, thereby reducing the area of a bit-line and capacitance of electrode improving a sensing margin of a subsequent DRAM operation.

What is claimed is:

1. A method for forming a bit-line of a semiconductor device, comprising the steps of:
   forming a gate electrode on a semiconductor substrate comprising a device isolation film;
   forming an interlayer insulating film on the semiconductor substrate including the gate electrode;
   selectively etching the interlayer insulating film to form bit-line contact holes exposing an upper surface of the gate electrode and a portion of the semiconductor substrate;
   forming a barrier metal layer on the interlayer insulating film including the bit-line contact holes;
   forming a CVD tungsten layer filling the bit-line contact hole on the barrier metal layer;
   polishing the CVD tungsten layer and the barrier metal layer until the interlayer insulating film is exposed to form a bit-line contact plug;
   subjecting the interlayer insulating film and the upper surface of the bit-line contact plug to a sputter etching process;
   forming a PVD tungsten layer on the interlayer insulating film and the upper surface of the bit-line contact plug; and
   selectively etching the PVD tungsten layer to form a tungsten bit-line.

2. The method according to claim 1, wherein the PVD tungsten layer has a thickness ranging from 500 to 700 Å.

3. The method according to claim 1, wherein the barrier metal layer comprises Ti/TiN.

4. The method according to claim 1, wherein the barrier metal layer has a thickness ranging from 100 to 200 Å.

5. The method according to claim 1, wherein the CVD tungsten layer has a thickness ranging from 2000 to 3000 Å.

6. The method according to claim 1, wherein the step of polishing the CVD tungsten layer and the barrier metal layer comprises an etch-back process using sulphur hexafluoride ($SF_6$).

* * * * *